United States Patent [19]
Dvir

[11] Patent Number: 6,002,607
[45] Date of Patent: Dec. 14, 1999

[54] READ-ONLY-MEMORY (ROM) HAVING A MEMORY CELL THAT STORES A PLURALITY OF BITS OF INFORMATION

[75] Inventor: Ran Dvir, Kfar Saba, Israel

[73] Assignee: National Semiconductor Corporation, Santa Clara, Calif.

[21] Appl. No.: 09/028,740

[22] Filed: Feb. 24, 1998

[51] Int. Cl.[6] .................................................. G11C 17/00
[52] U.S. Cl. .......................... 365/103; 365/94; 365/104; 365/168
[58] Field of Search .................................. 365/103, 104, 365/168, 94, 63, 185.03

[56] References Cited

U.S. PATENT DOCUMENTS

| | | | |
|---|---|---|---|
| 5,392,233 | 2/1995 | Iwase | 365/104 |
| 5,471,416 | 11/1995 | Azmanov | 365/104 |
| 5,494,842 | 2/1996 | Azmanov | 437/52 |
| 5,517,061 | 5/1996 | Azmanov | 257/758 |
| 5,528,534 | 6/1996 | Shoji | 365/94 |
| 5,825,686 | 10/1998 | Schmitt-Landsiedel et al. | 365/94 |
| 5,835,396 | 11/1998 | Zhang | 365/94 |

*Primary Examiner*—Tan T. Nguyen
*Attorney, Agent, or Firm*—Limbach & Liumbach L.L.P.

[57] ABSTRACT

A column of read-only-memory (ROM) cells is programmed to store two or more bits of information in each cell by forming a plurality of coding (bit) lines adjacent to the column of cells, and selectively connecting the cells to the plurality of coding lines so that the different logic conditions defined by the two or more bits are represented by the coding lines that are connected to a memory cell.

26 Claims, 4 Drawing Sheets

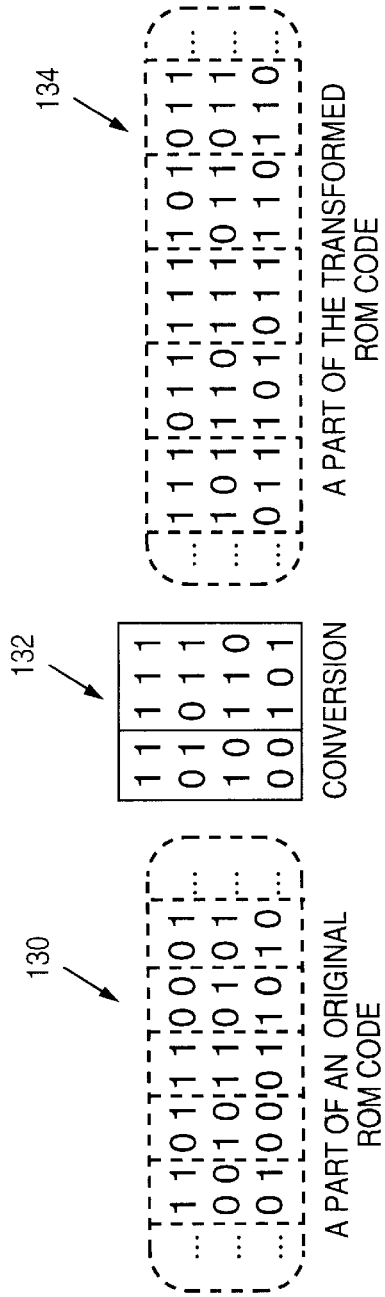
FIG. 5A  A PART OF AN ORIGINAL ROM CODE
FIG. 5B  CONVERSION
FIG. 5C  A PART OF THE TRANSFORMED ROM CODE
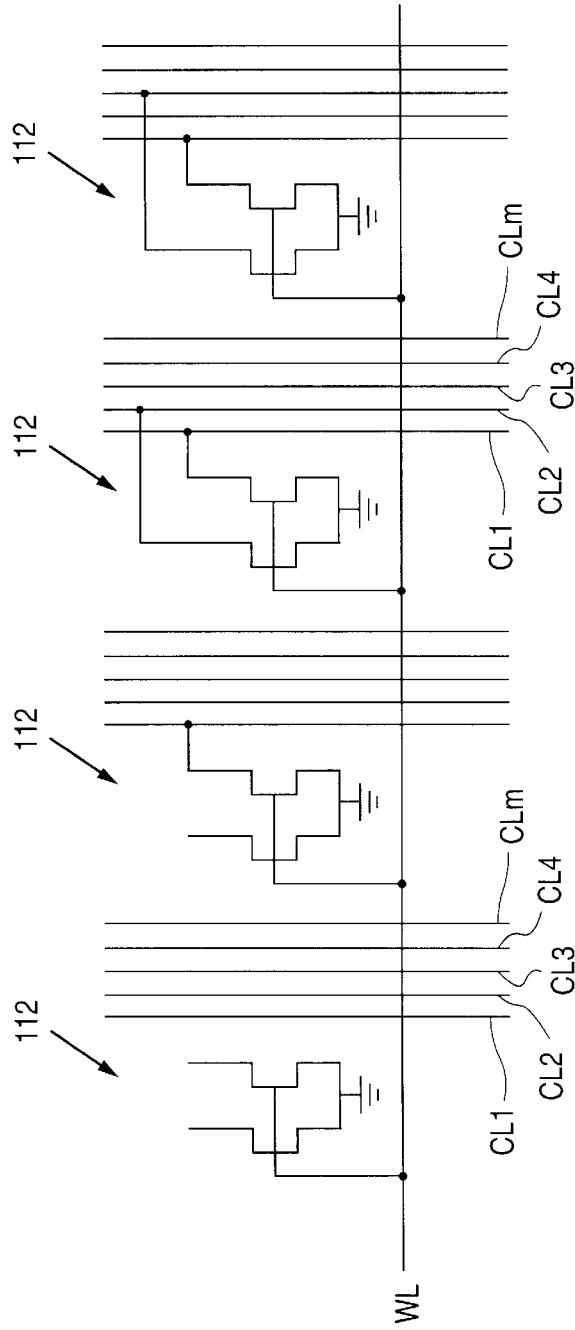
FIG. 8

READ-ONLY-MEMORY (ROM) HAVING A MEMORY CELL THAT STORES A PLURALITY OF BITS OF INFORMATION

BACKGROUND OF THE INVENTION

1. Field of the Invention

The present invention relates to a read-only-memory (ROM) and, more particularly, to a ROM which has a memory cell that stores a plurality of bits of information.

2. Description of the Related Art

A read-only-memory (ROM) is a non-volatile memory that is only programmed once. As a result, ROMs are commonly used in applications where the information stored in the ROM is not expected to change.

FIG. 1 shows a block diagram that illustrates a prior art ROM 1. As shown in FIG. 1, ROM 1 includes a storage section 10 that has a plurality of memory cells 12 arranged in rows and columns, and a decoder section 14 that decodes an input address to identify the memory cells 12 in storage section 10 that are to be read. As is well known, each memory cell 12 in storage section 10 permanently stores one bit of information as one of two logic states.

As further shown in FIG. 1, ROM 1 additionally includes a precharge section 18 that, along with decoder section 14, supplies operational voltages to the cells in storage section 10 that are to be read, and a sense amp section 20 that senses the output voltage associated with each of the memory cells 12 that have been read.

In addition, ROM 1 also includes a multiplexor section 22 that passes the output voltages from the memory cells 12 to the sense amp section 20, and a control section 24 that controls the operation of the various sections of ROM 1.

FIG. 2 shows a schematic diagram that illustrates storage section 10. As shown in FIG. 2, each memory cell 12 of the plurality of memory cells formed in storage section 10 is implemented with a single MOS transistor.

In addition, storage section 10 also includes a plurality of word lines WL1–WLn which are arranged so that each word line WL corresponds with one row of cells, and a plurality of bit lines BL1–BLm which are arranged so that each bit line BL corresponds with one column of cells.

Each cell 12 is programmed to store one of the two logic states during the fabrication of the cell by connecting the gate of the transistor to either the source of the transistor if the cell is to store a first logic state, such as a logic "1", or the word line WL that corresponds with the cell if the cell is to store a second logic state, such as a logic "0".

In operation, when a predefined number of memory cells 12 in a row of cells are to be read, such as a byte of cells, decoder section 14 applies a gate voltage to the word line WL that corresponds with the row that contains the cells which are to be read, while grounding the other word lines WL. At the same time, precharge section 18 applies a precharged drain voltage to the bit lines BL that correspond with the cells that are to be read.

If the gate of a particular cell 12 is connected to the source of the transistor, such as the first cell in the first row of FIG. 2, then the gate voltage will not turn on the transistor. This, in turn, allows the bit line BL that corresponds with the cell to remain charged to the precharged drain voltage. As a result, sense amp section 20 senses a "high" voltage condition on the bit line BL, and outputs a logic "1".

On the other hand, if the gate of a particular cell 12 is connected to the word line WL, such as the second cell in the first row of FIG. 2, then the gate voltage will turn on the transistor, thereby causing the bit line BL that corresponds with the cell to be discharged to ground. As a result, sense amp section 20 senses a low voltage condition on the bit line BL, and outputs a logic "0".

Although ROMs are well known, as the systems that utilize ROMs get smaller, faster, and cheaper, the centrality that ROMs play in many applications means that there is a continuing need for ROMs that are faster, consume less power, and require less silicon real estate to implement.

SUMMARY OF THE INVENTION

The present invention provides a read-only-memory (ROM) that is faster and consumes less power and area than prior art ROMs by storing a plurality of bits of information in each memory cell.

The ROM of the present invention includes a column of memory cells having a plurality of rows. Each memory cell, in turn, permanently stores the plurality of bits of information as one of the plurality of logic states that are defined by the number of bits of information that are stored in the cell. In addition, the plurality of logic states includes a plurality of connection-defined logic states.

The ROM of the present invention also includes a plurality of word lines that correspond to the plurality of rows. Each word line, in turn, is connected to a corresponding memory cell in the column of memory cells.

In accordance with the present invention, the ROM also includes a plurality of coding lines that are formed adjacent to the column of cells. Each cell in the column of cells that stores a connection-defined logic state is connected to a coding line of the plurality of coding lines so that the memory cells that store different connection-defined logic states are connected to different coding lines.

In operation, for example, two bits of information having four logical states are stored in a memory cell having three adjacent coding lines by defining a first logic state to be the condition when a memory cell is not connected to any of the coding lines, and a second logic state to be the condition when a memory cell is connected to a first coding line.

Similarly, the third and fourth logical states are defined as the conditions when the memory cell is connected to the second and third coding lines, respectively. Thus, when a cell in the column of cells is read, a three-bit voltage pattern is present on the coding lines that represents one of the four logical states.

Further, the ROM of the present invention also includes a sense amp/converter that senses the voltage pattern on the coding lines, and outputs a word that represents the logic states of the bits stored in the cell. In the above example, the three-bit voltage pattern is sensed and converted into a two-bit word that identifies the logic states of the two bits.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 5A–5C are diagrams illustrating the conversion of a ROM code in accordance with the present invention. FIG. 5A is an original ROM code segment 130 which has been divided into a series of two-bit segments. FIG. 5B is a conversion key 132 that converts a two-bit sequence into a three-bit sequence. FIG. 5C is a transformed ROM code 134 that represents the original ROM code 130 after it has been converted from a two-bit sequence into a three-bit sequence.

FIG. 8 is a schematic diagram illustrating four bits of information stored in a two transistor memory cell.

DETAILED DESCRIPTION

Figure 1:
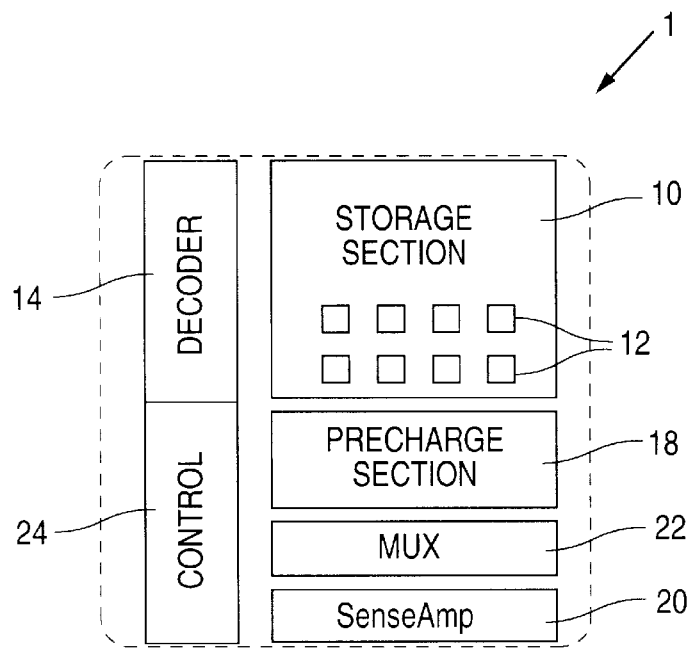
FIG. 1 is a block diagram illustrating a prior art ROM 1.
Figure 2:
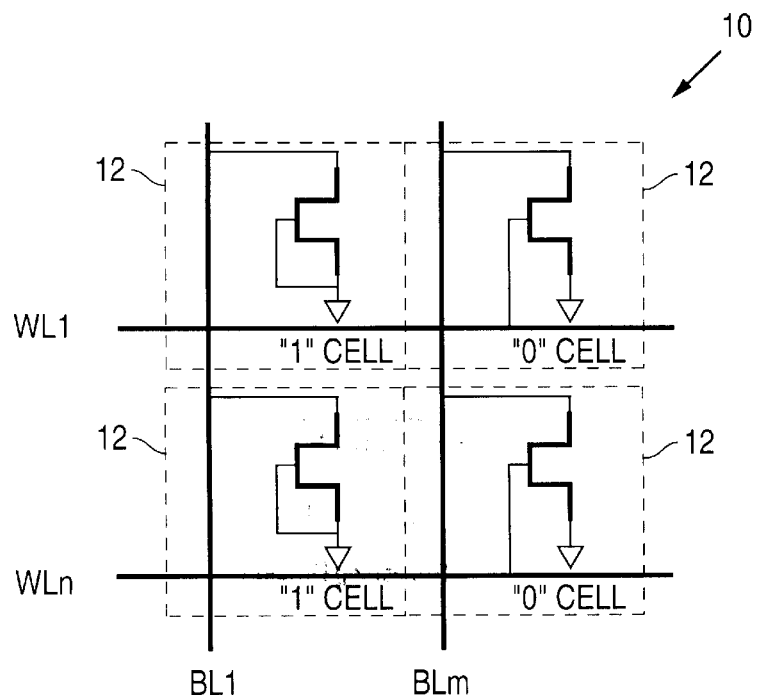
FIG. 2 is a schematic diagram illustrating storage section 10.
Figure 3:
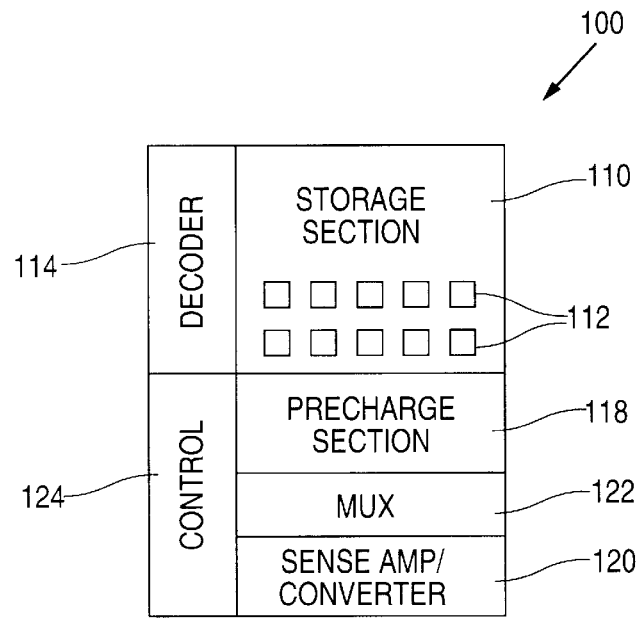
FIG. 3 is a block diagram illustrating a ROM 100 in accordance with the present invention.

FIG. 3 shows a block diagram that illustrates a ROM 100 in accordance with the present invention. As described in greater detail below, the present invention increases the speed and reduces the power and area consumed by a ROM by storing a plurality of bits of information in each memory cell.

As shown in FIG. 3, ROM 100 includes a storage section 110 that has a plurality of memory cells 112 arranged in rows and columns, and a decoder section 114 that decodes an input address to identify the memory cells 112 in storage section 110 that are to be read.

As further shown in FIG. 3, ROM 100 additionally includes a precharge section 118 that, along with decoder section 114, supplies operational voltages to the memory cells 112 in storage section 110 that are to be read.

In addition, ROM 100 further includes a sense amp/converter section 120 that senses the voltages output from each memory cell 112 that has been read, and outputs a multi-bit word for each memory cell that has been read that identifies the logic states of the bits stored in the cell in response to the sensed output voltages.

Further, ROM 100 also includes a multiplexor section 122 that passes the output voltages from the memory cells 112 to the sense amp/converter section 120, and a control section 124 that controls the operation of the various sections of ROM 100.

Figure 4:
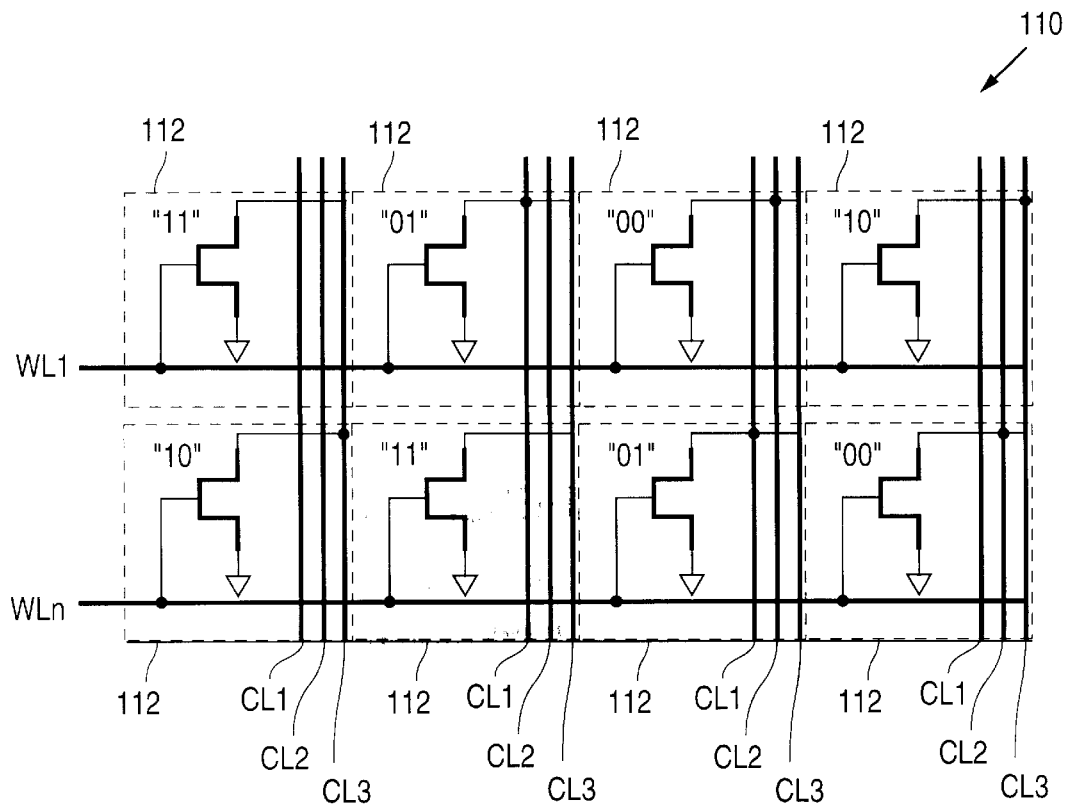
FIG. 4 is a schematic diagram illustrating storage section 110 in accordance with the present invention.

FIG. 4 shows a schematic diagram that illustrates storage section 110 in accordance with the present invention. As shown in FIG. 4, each cell 112 of the plurality of memory cells is implemented with a single MOS transistor.

In addition, storage section 110 also includes a plurality of word lines WL1–WLn which are arranged so that each word line WL corresponds with one row of cells, and three coding (bit) lines CL1–CL3 that correspond with each column of cells.

In accordance with the present invention, each memory cell 112 in FIG. 4 permanently stores two bits of information by storing one of the four logic states that are defined by two bits of information.

Prior to programming a cell, the original multi-bit ROM code is divided into a series of two-bit segments which are then each converted into three-bit segments to form a transformed ROM code. Programming is then accomplished during fabrication by selectively connecting the drains of the transistors to the coding lines CL1–CL3 in accordance with the transformed ROM code.

FIGS. 5A–5C show diagrams that illustrate the conversion of a ROM code in accordance with the present invention. FIG. 5A shows an original ROM code 130 which has been divided into a series of two-bit segments. FIG. 5B shows an example of a conversion key 132 that converts a two-bit segment into a three-bit segment. FIG. 5C shows a transformed ROM code 134 that represents the original ROM code 130 after it has been converted from a two-bit segment into a three-bit segment by conversion key 132.

As shown in FIG. 5B, a "1-1" is converted into a "1-1-1", a "0-1" is converted into a "0-1-1", a "1-0" is converted into a "1-1-0", and a "0-0" is converted into a "1-0-1".

Once the transformed ROM code 134 has been prepared, each three-bit segment is used to define which, if any, of the coding lines CL are to be connected to the drain of a cell.

For example, as shown in FIG. 4, the first cell in the first row, which stores the logic state "1-1" as a "1-1-1", is programmed by not connecting the drain of the cell to any of the coding lines CL. Similarly, the second cell in the first row, which stores the logic state "0-1" as a "0-1-1", is programmed by connecting the drain of the cell to the first coding line CL1.

The third and fourth cells in the first row, which store the logic states "0-0" and "1-0" as a "1-0-1" and a "1-1-0", respectively, are programmed by connecting the drains of the cells to the second and third coding lines CL2 and CL3, respectively.

Thus, in the implementation shown in FIG. 4, of the possible logic states, one of the logic states is defined by no connection, while the remaining logic states are connection-defined logic states in that the specific drain-to-coding line connection defines the logic state held by the cell. Thus, the total number of logic states includes a plurality of connection-defined logic states.

In operation, when a predefined number of memory cells 112 in a row of cells are to be read, such as four cells, decoder section 114 applies a gate voltage to the word line WL that is connected to the row which contains the cells that are to be read, while grounding the other word lines WL. At the same time, precharge section 118 applies a precharged drain voltage to the coding lines CL that are connected to the cells that are to be read.

If the drain of a particular cell 112 is not connected to one of the corresponding coding lines CL, such as the first cell in the first row, then the transistor will not turn on when the gate voltage is applied. As a result, each of the corresponding coding lines CL remains charged to the precharged drain voltage.

Sense amp/converter section 120 then senses three "high" voltages which are reconverted from the three-bit segment back into the original two-bit segment. The two-bit segment is then output as a two-bit word that identifies the logic states of the two bits of information in the first cell, i.e., a "1-1".

If the drain of a particular cell 112 is connected to the first coding line CL1, such as the second cell in the first row, then the transistor will turn on when the gate voltage is applied. As a result, the first coding line CL1 is discharged to ground while each of the remaining coding lines CL2–CL3 remain charged to the precharged drain voltage.

Sense amp/converter section 120 then senses a "low" voltage and two "high" voltages which are reconverted from the three-bit segment back into the original two-bit segment. The two-bit segment is then output as a two-bit word that identifies the logic states of the two bits of information in the second cell, i.e., a "0-1".

Similarly, if the drain of a particular cell 112 is connected to the second coding line CL2, such as the third cell in the first row, then the transistor will turn on when the gate voltage is applied. As a result, the second coding line CL1 is discharged to ground while the first and third coding lines CL1 and CL3 remain charged to the precharged drain voltage.

Sense amp/converter section 120 then senses a "high" voltage, a "low" voltage, and a "high" voltage which are reconverted from the three-bit segment back into the original two-bit segment. The two-bit segment is then output as a two-bit word that identifies the logic states of the two bits of information in the third cell, i.e., a "0-0".

Finally, if the drain of a particular cell 112 is connected to the third coding line CL3, such as the fourth cell in the first row, then the transistor will turn on when the gate voltage is applied. As a result, the third coding line CL3 is discharged to ground while the first and second coding lines CL1 and CL2 remain charged to the precharged drain voltage.

Sense amp/converter section 120 then senses a "high" voltage, a "high" voltage, and a "low" voltage which are reconverted from the three-bit segment back into the original two-bit segment. The two-bit segment is then output as a two-bit word that identifies the logic states of the two bits of information in the fourth cell, i.e., a "1-0". Thus, eight bits of data are read from four memory cells in the implementation shown in FIG. 4.

Figure 6:
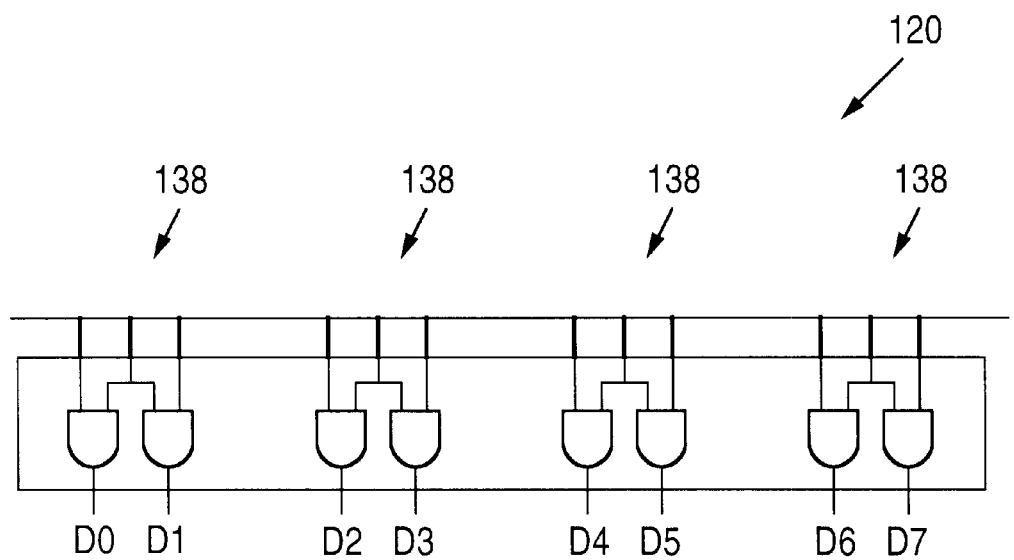
FIG. 6 is a schematic diagram illustrating sense amp/converter section 120 in accordance with the present invention.

FIG. 6 shows a schematic diagram that illustrates sense amp/converter section 120 in accordance with the present invention. As shown in FIG. 6, sense amp/converter section 120 includes a plurality of sense amp/converters 138 that correspond with a predetermined number of columns, such as four columns.

Each of the converters 138 is implemented with a pair of AND gates, although other logic combinations can also be used to obtain the same reverse conversion. The AND gates function as the sense amps by increasing the drive of the AND gates. Alternately, a conventional sense amp can be used with each pair of AND gates.

Figure 7:
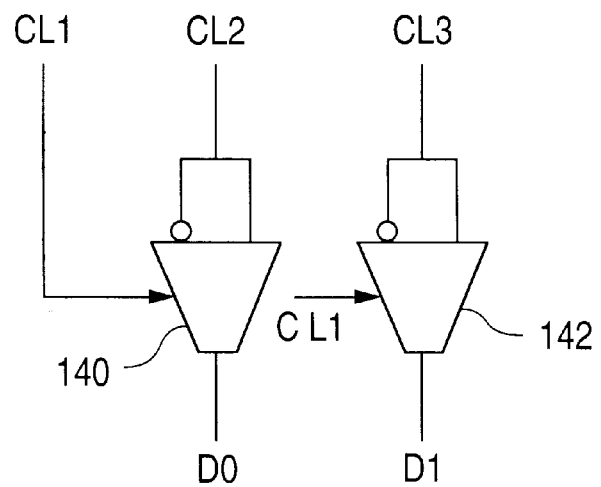
FIG. 7 is a schematic diagram illustrating an alternate implementation of sense amp/converter section 120 in accordance with the present invention.

FIG. 7 shows a schematic diagram that illustrates an alternate implementation of sense amp/converter section 120 in accordance with the present invention. As shown in FIG. 7, rather than using a pair of AND gates with each column, a pair of multiplexors 140 and 142 are instead utilized with each column.

In the FIG. 7 implementation, first coding line CL1 is utilized as the select line for both multiplexors 140 and 142, while coding line CL2 is connected to the inverting and non-inverting inputs of multiplexor 140 and coding line CL3 is connected to the inverting and non-inverting inputs of multiplexor 142. A truth table for multiplexors 140 and 142 is shown in Table 1.

TABLE 1

| CL1 | CL2 | CL3 | D0 | D1 |
|---|---|---|---|---|
| 1 | 1 | 1 | 1 | 1 |
| 1 | 1 | 0 | 1 | 0 |
| 1 | 0 | 1 | 0 | 1 |
| 0 | 1 | 1 | 0 | 0 |

Further, the FIG. 7 implementation is scalable. Thus, if five coding lines are utilized with each column, two additional multiplexors are utilized so that first coding line CL1 is connected to the select input of all four multiplexors, while coding lines CL2, CL3, CL4, and CL5 are connected to the inverting and non-inverting inputs of a corresponding one of the multiplexors.

Thus, in accordance with the present invention, a ROM has been described that has a plurality of memory cells, a plurality of word lines, and a plurality of coding lines that correspond with each column of cells.

Each memory cell permanently stores a plurality of bits of information as one of the plurality of logic states that are defined by the number of bits of information that are stored in the cell. The plurality of logic states, in turn, includes a plurality of connection-defined logic states that may or may not be equal to the plurality of logic states, depending on the number of coding lines that are used.

In accordance with the present invention, each cell that stores a connection-defined logic state is connected to a coding line of the plurality of coding lines so that the memory cells that store different connection-defined logic states are connected to different coding lines.

In addition to storing two bits of information in a one transistor memory cell, additional bits of information can be stored in each memory cell 112 by utilizing additional transistors and coding lines.

As shown in Table 2, four bits of information having 16 logic states can be stored in a two transistor memory cell that utilizes five coding (bit) lines, while eight bits of information having 256 logic states can be stored in a four transistor memory cell that utilizes nine coding (bit) lines.

TABLE 2

| # of Bit Lines | # of Transistors | # of Bits |
|---|---|---|
| 3 | 1 | 2 |
| 5 | 2 | 4 |
| 9 | 4 | 8 |
| . | . | . |
| . | . | . |
| . | . | . |
| 2x + 1 | x | 2x |

Thus, as shown in Table 2, the present invention requires only one more bit line than would be required by a conventional ROM. For example, a prior art ROM requires eight cells, each having one bit line, to represent eight bits, while the present invention represents eight bits with one cell having four transistors and nine bit lines.

FIG. 8 shows a block diagram that illustrates four bits of information stored in a two transistor memory cell. As shown in FIG. 8, to represent four bits of information in a two transistor cell, the connection-defined logic states require each memory cell to be connected to zero, one, or two coding lines.

In a first alternate embodiment, rather than using a single transistor and three coding lines to represent the four logic states of a two-bit segment, a single transistor and four coding lines can be used to represent the four logic states of the two-bit segment.

In this case, all of the logic states are represented by specific drain-to-coding line connections. As a result, the total number of logic states is the same as the plurality of connection-defined logic states. This embodiment, however, is less efficient with respect to power consumption because the first logic state will have four zeros instead of three.

In a second alternate embodiment, three bits of information can be stored in a single-transistor memory cell by utilizing seven or eight coding (bit) lines.

In a third alternate embodiment, rather than representing one of the logic states by not connecting the memory cell to one or more of the coding lines, this logic state can also be represented by not connecting the gate of the transistor to the word line, the gate and drain of the transistor to the word line and coding lines, respectively, or by not forming a transistor at all.

One advantage of the present invention is that the average word line capacitance is substantially the same as that of an equally-sized prior art ROM. Although all of the gates of the transistors in a row are connected to the corresponding word line in the FIG. 4 embodiment, there are 50% fewer transistors because each cell represents two bits.

In the prior art, on average only 50% of the transistors in a row are connected to the corresponding word line, but there are twice as many transistors since each transistor represents only one bit. Therefore, the word line capacitance in both approaches is substantially the same.

Another advantage is that the capacitance on the coding (bit) lines is reduced by approximately 75% in the FIG. 4 embodiment of the present invention. In the prior art, every memory cell in a column of cells is connected to the corresponding bit line via the drain of the transistor in the memory cell.

However, in the FIG. 4 embodiment, on average, only one memory cell out of every four cells in a column of cells is connected to the same coding (bit) line via the drains of the transistors. Thus, by adding one additional bit line, the FIG. 4 embodiment provides a 75% reduction in the bit line capacitance which, in turn, increases the operational speed of ROM 100. (Prior art ROMs require two cells, each having one bit line, to represent two bits, while the present invention represents two bits with one cell having three bit lines).

The reduced coding (bit) line capacitance in the FIG. 4 embodiment also reduces by approximately 25% the power consumed by ROM 100. In a prior art ROM, a "0-0" bit pattern is programmed by connecting the gates of both cells to the word line which, in turn, causes the corresponding two bit lines to be discharged when the cells are read.

However, as shown in FIG. 4, when a "0-0" pattern is read from a single cell, such as the third cell in the first row, only one of the three coding lines is discharged. As a result, the present invention requires less power than conventional ROMs. This benefit, however, is gradually reduced when, as shown in Table 3, additional transistors are used to implement a memory cell.

Yet a further advantage of the present invention is that approximately 25% less area is required to store two bits of information in a memory cell having a single transistor and three coding lines than is required to store two bits of information in a prior art ROM that uses two transistors and two bit lines to store the two bits of information.

TABLE 3

| | | | % of '0' |
|---|---|---|---|
| 2 Bit | - - > | 3 Bit | |
| 00 | | 011 | |
| 01 | | 101 | in 2 bit -> 4 - '0' |
| 10 | | 110 | in 3 bit -> 3 - '0' |
| 11 | | 111 | Power Consumption reduces by 3/4 = 25%. |
| 4 Bit | - - > | 5 Bit | |
| 0000 | | 01111 | |
| 0001 | | 01110 | in 4 bit -> 32 - '0' |
| 0010 | | 01101 | in 5 bit -> 25 - '0' |

TABLE 3-continued

| | | % of '0' |
|---|---|---|
| 0011 | 10011 | Power Consumption |
| 0100 | 01011 | reduces by 25/32 = 22%. |
| 0101 | 10101 | |
| 0110 | 10110 | |
| 0111 | 10111 | |
| 1000 | 00111 | |
| 1001 | 11001 | |
| 1010 | 11010 | |
| 1011 | 11011 | |
| 1100 | 11100 | |
| 1101 | 11101 | |
| 1110 | 11110 | |
| 1111 | 11111 | |

As 8 bit→9 bit to 16 bit→17 bit are checked, the percentages decline.

It should be understood that various alternatives to the embodiment of the invention described herein may be employed in practicing the invention. For example, the three-bit sequences in FIG. 5B can be assigned to other two-bit sequences, while logic arrangements other than pairs of AND gates can be used to reconvert the three-bit sequences into two-bit sequences.

Thus, it is intended that the following claims define the scope of the invention and that methods and structures within the scope of these claims and their equivalents be covered thereby.

What is claimed is:

1. A read-only-memory (ROM) comprising:
    a column of memory cells having a plurality of rows, each memory cell storing one of a plurality of logic states, the plurality of logic states including a plurality of connected-defined logic states;
    a plurality of word lines corresponding to the plurality of rows, each word line being connected to a corresponding memory cell in the column of memory cells;
    a plurality of coding lines formed adjacent to the column of cells, each cell in the column of cells that stores a connection-defined logic state being connected to a coding line of the plurality of coding lines so that memory cells that store different connection-defined logic states are connected to different coding lines; and
    a sense amp/converter connected to receive the plurality of coding lines, the sense amp/converter sensing a voltage on each coding line, and outputting a x-bit word that represents the logic state stored by a cell in the column of cells.

2. The ROM of claim 1 wherein a logic state is defined by a memory cell being unconnected to the coding lines.

3. The ROM of claim 2 wherein the memory cell includes a transistor having a gate.

4. The ROM of claim 3 wherein when a memory cell is to be unconnected to the coding lines, the gate of the transistor is unconnected to a word line.

5. The ROM of claim 2 wherein when a memory cell in the column of memory cells is to be unconnected to the coding lines, the memory cell includes no transistors.

6. The ROM of claim 1 wherein the sense amp/converter includes a plurality of AND gates connected to receive the logic state for each coding line.

7. The ROM of claim 1 wherein x is one less than the plurality of coding lines.

8. A read-only-memory (ROM) comprising:
    a column of memory cells having a plurality of rows, each memory cell having a plurality of transistors, and storing one of a Plurality of logic states;

a plurality of word lines corresponding to the plurality of rows, each word line being connected to a corresponding memory cell in the column of memory cells; and a plurality of coding lines formed adjacent to the column of cells, the coding lines being selectively connected to the plurality of transistors in each memory cell to define one of the plurality of logic states.

9. The ROM of claim 8 wherein a logic state is defined by the transistors in a memory cell being unconnected to the coding lines.

10. The ROM of claim 8 wherein a logic state is defined by a memory cell being unconnected to the coding lines.

11. The ROM of claim 10 wherein when a memory cell is to be unconnected to the coding lines, the memory cell includes no transistors.

12. The ROM of claim 10 wherein when a memory cell is to be unconnected to the coding lines, the memory cell is unconnected to a corresponding word line.

13. The ROM of claim 8 and further comprising a sense amp/converter connected to receive information from the plurality of coding lines, the sense amp/converter sensing a voltage on each coding line, and outputting a word that represents the logic state stored by a cell in the column of cells, a number of coding lines being greater than a number of bits in the word.

14. A read-only-memory (ROM) comprising:

a plurality of memory cells formed in a plurality of rows and a plurality of columns, each memory cell storing one of a plurality of logic states, the plurality of logic states including a plurality of connected-defined logic states;

a plurality of word lines corresponding to the plurality of rows of memory cells, each word line being connected to a corresponding row of memory cells;

a plurality of coding lines formed adjacent to each column of cells, each cell that stores a connection-defined logic state being connected to a coding line of the plurality of coding lines formed adjacent to a column of cells so that memory cells that store different connection-defined logic states are connected to different coding lines; and a plurality of sense amp/converters corresponding to a plurality of columns of memory cells, each sense amp/converter receiving a corresponding plurality of coding lines, sensing a voltage on each of the coding lines of the corresponding plurality of coding lines, and outputting an x-bit word that represents the logic state stored in each cell.

15. The ROM of claim 14 wherein x is one less than the plurality of coding lines.

16. A read-only-memory (ROM) comprising:

a plurality of memory cells formed in a plurality of rows and a plurality of columns, each memory cell having a plurality of transistors, and storing one of a plurality of values;

a plurality of word lines corresponding to the plurality of rows of memory cells, each word line being connected to a corresponding row of memory cells; and a plurality of coding lines formed adjacent to each column of cells, the coding lines adjacent to a column of cells being selectively connected to the plurality of transistors in each memory cell in the column to define one of the plurality of logic states.

17. The ROM of claim 16 wherein a logic state is defined by a memory cell being unconnected to the coding lines.

18. The ROM of claim 16 wherein a logic state is defined by the transistors in a memory cell being unconnected to the coding lines.

19. The ROM of claim 16 wherein a logic state is defined by a memory cell being unconnected to the coding lines.

20. The ROM of claim 19 wherein when a memory cell is to be unconnected to the coding lines, the memory cell includes no transistors.

21. The ROM of claim 19 wherein when a memory cell is to be unconnected to the coding lines, the memory cell is unconnected to a corresponding word line.

22. The ROM of claim 16 and further comprising a plurality of a sense amp/converters, each sense amp/converter being connected to receive information from the plurality of coding lines associated with a column of cells, the sense amp/converter sensing a voltage on each coding line, and outputting a word that represents the logic state stored by a cell in the column of cells, a number of coding lines being greater than a number of bits in the word.

23. A method for forming a read-only-memory (ROM), the method comprising the steps of:

forming a column of memory cells having a plurality of rows, each memory cell storing one of a plurality of values, the plurality of values including a plurality of connected values;

forming a plurality of word lines corresponding to the plurality of rows, each word line being connected to a corresponding memory cell in the column of memory cells;

forming a plurality of coding lines adjacent to the column of cells, each cell in the column of cells that stores a connected value being connected to a coding line of the plurality of coding lines, memory cells that store different connected values being connected to different coding lines;

forming a sense amp connected to receive the plurality of coding lines, the sense amp sensing a voltage on each coding line, and outputting a logic state for each coding line that represents the voltage sensed on each coding line; and forming a converter connected to receive the logic state of each coding line output by the sense amp, the converter outputting an n-bit word that represents the logic state of each coding line output by the sense amp.

24. The method of claim 23 wherein a logic state is defined by a memory cell being unconnected to the coding lines.

25. The method of claim 24 wherein when a memory cell in the column of memory cells is to be unconnected to the coding lines, the memory cell includes no transistors.

26. The method of claim 24 wherein when a memory cell is to be unconnected to the coding lines, the memory cell is unconnected to a word line.

* * * * *